US011320257B2

(12) United States Patent
Sato et al.

(10) Patent No.: US 11,320,257 B2
(45) Date of Patent: May 3, 2022

(54) COMPONENT MACHINING APPARATUS

(71) Applicant: SUBARU CORPORATION, Tokyo (JP)

(72) Inventors: Yoichi Sato, Tokyo (JP); Marosuke Kikuchi, Tokyo (JP); Yuki Tanaka, Tokyo (JP); Yasunori Shibao, Tokyo (JP); Haruka Miyanishi, Tokyo (JP); Toshimasa Kobayashi, Tokyo (JP)

(73) Assignee: SUBARU CORPORATION, Tokyo (JP)

(*) Notice: Subject to any disclaimer, the term of this patent is extended or adjusted under 35 U.S.C. 154(b) by 55 days.

(21) Appl. No.: 16/655,942

(22) Filed: Oct. 17, 2019

(65) Prior Publication Data
US 2020/0166330 A1 May 28, 2020

(30) Foreign Application Priority Data

Nov. 26, 2018 (JP) .............................. JP2018-219856

(51) Int. Cl.
G01B 11/00 (2006.01)
G05B 19/18 (2006.01)
G06F 30/00 (2020.01)

(52) U.S. Cl.
CPC ............ *G01B 11/005* (2013.01); *G05B 19/18* (2013.01); *G06F 30/00* (2020.01)

(58) Field of Classification Search
CPC ........ G01B 11/005; G05B 2219/35062; G05B 2219/31068; G05B 2219/37205; G05B 2219/31066; G05B 2219/37198; G05B 2219/37452; G05B 2219/50252; G05B 19/18; G05B 19/41805; G05B 19/401; G05B 19/4097; G06F 30/00; Y02P 90/02
See application file for complete search history.

(56) References Cited

U.S. PATENT DOCUMENTS 5,106,290 A * 4/1992 Carver .................... G06T 17/00
425/470
5,751,584 A * 5/1998 Yuasa ................ G05B 19/4061
700/166

(Continued)

FOREIGN PATENT DOCUMENTS

EP      3 531 221 A2    8/2019
JP         6174208 B2    8/2017

OTHER PUBLICATIONS

Extended European Search Report issued in corresponding European Patent Application No. 19 20 4913 dated May 13, 2020.

*Primary Examiner* — Sang H Nguyen
(74) *Attorney, Agent, or Firm* — Troutman Pepper Hamilton Sanders LLP

(57) ABSTRACT

A component machining apparatus includes a measurement result acquiring unit and a machining data generator. The measurement result acquiring unit is configured to acquire a measurement result obtained by a measurer configured to measure a three-dimensional shape of a manufactured component among components of a structure. The manufactured component is manufactured earlier than a component of interest. The machining data generator is configured to generate machining data of the component of interest based on the measurement result of the manufactured component that has been acquired by the measurement result acquiring unit.

4 Claims, 3 Drawing Sheets

(56) References Cited

U.S. PATENT DOCUMENTS

| | | | |
|---|---|---|---|
| 2002/0000047 A1* | 1/2002 | Yoda | G05B 19/401 |
| | | | 33/503 |
| 2011/0246132 A1* | 10/2011 | Sato | B23Q 5/40 |
| | | | 702/150 |
| 2013/0282162 A1* | 10/2013 | Griggs | G05B 19/18 |
| | | | 700/190 |
| 2014/0233839 A1* | 8/2014 | Morita | G06T 7/564 |
| | | | 382/141 |
| 2014/0236334 A1 | 8/2014 | Glasscock et al. | |
| 2015/0367579 A1 | 12/2015 | Laudrain | |
| 2016/0224015 A1* | 8/2016 | Tanigawa | G05B 19/4097 |
| 2018/0113425 A1 | 4/2018 | Nakashima et al. | |
| 2018/0154489 A1* | 6/2018 | Tada | G05B 19/401 |

* cited by examiner

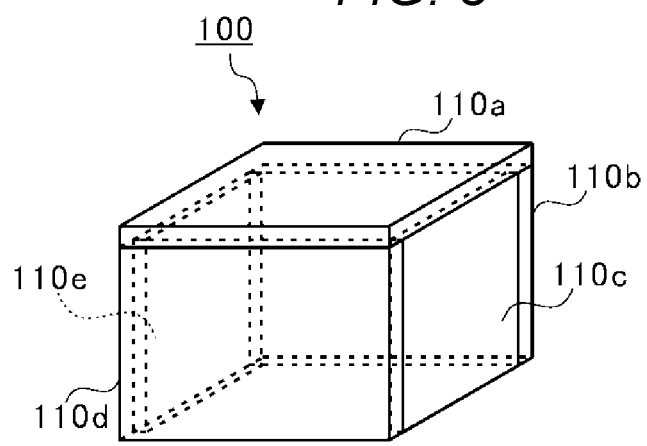
FIG. 3
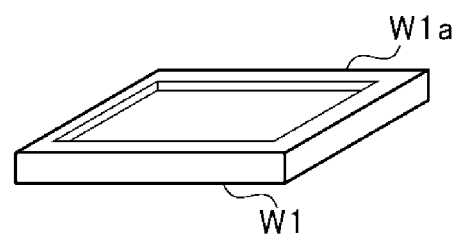

COMPONENT MACHINING APPARATUS

CROSS-REFERENCE TO RELATED APPLICATIONS

The present application claims priority from Japanese Patent Application No. 2018-219856 filed on Nov. 26, 2018, the entire contents of which are hereby incorporated by reference.

BACKGROUND

The disclosure relates to a component machining apparatus.

In an assemblage site to assemble multiple components into a single structure, manufacturing variances or other factors of the components may make gaps between the components assembled together. In such a case, shims are inserted in the gaps to fill up the gaps (for example, Japanese Patent No. 6174208).

SUMMARY

An aspect of the disclosure provides a component machining apparatus including: a measurement result acquiring unit and a machining data generator. The measurement result acquiring unit is configured to acquire a measurement result obtained by a measurer configured to measure a three-dimensional shape of a manufactured component among components of a structure. The manufactured component is manufactured earlier than a component of interest. The machining data generator is configured to generate machining data of the component of interest based on the measurement result of the manufactured component that has been acquired by the measurement result acquiring unit.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

FIG. 3 is a diagram illustrating a workpiece of a component.

DETAILED DESCRIPTION

Figure 1:
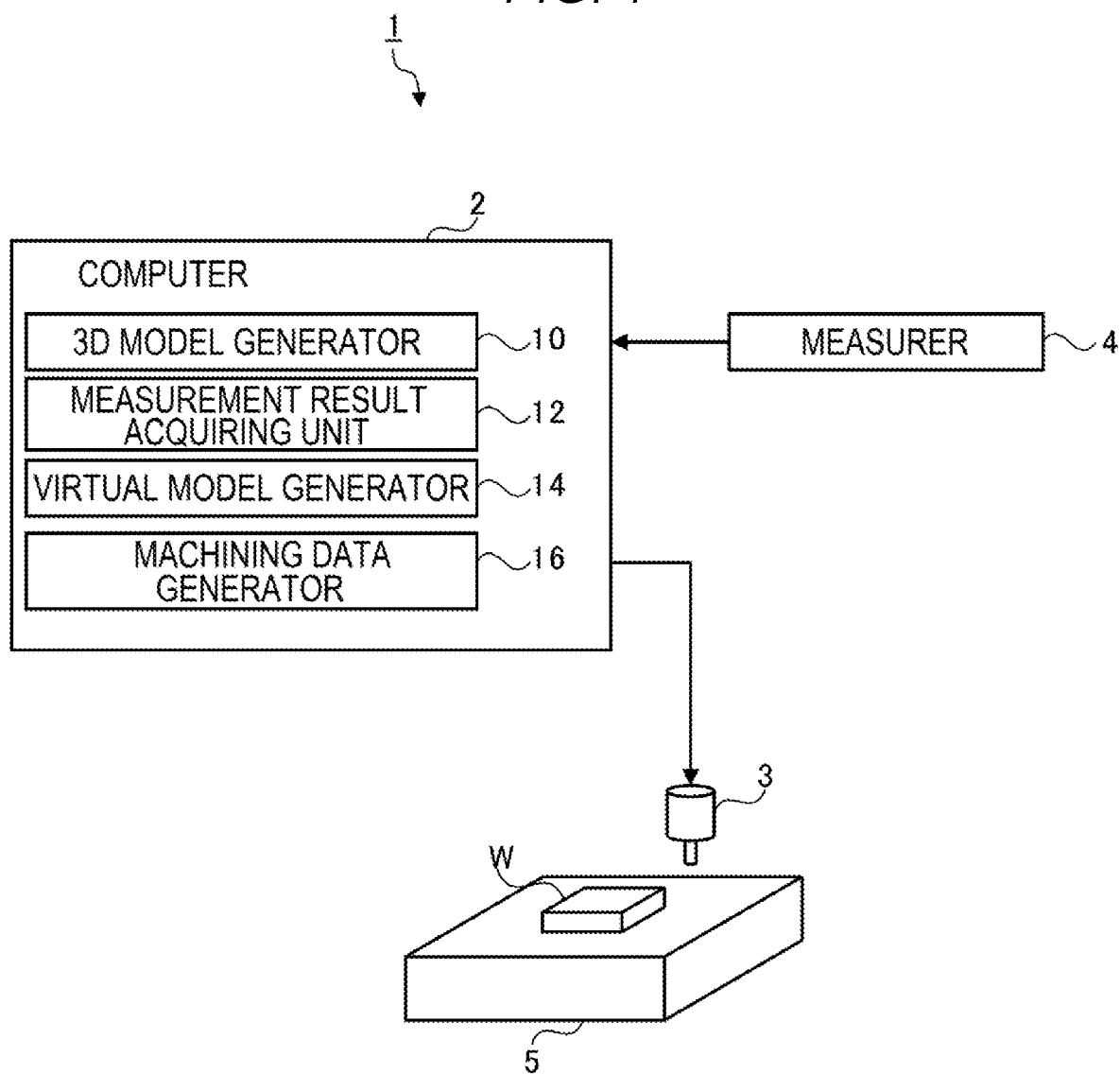
FIG. 1 is a diagram illustrating a configuration of a component machining apparatus.

In the above-described method of inserting shims in the gaps, the shims are to be manufactured to fit in the gaps, thereby increasing the number of working steps. There is room for improvement in this respect.

It is desirable to provide a component machining apparatus to reduce the number of working steps.

In the following, a preferred but non-limiting embodiment of the disclosure is described in detail with reference to the accompanying drawings. Note that sizes, materials, specific values, and any other factors illustrated in the embodiment are illustrative for easier understanding of the disclosure, and are not intended to limit the scope of the disclosure unless otherwise specifically stated. Further, elements in the following example embodiment which are not recited in a most-generic independent claim of the disclosure are optional and may be provided on an as-needed basis. Throughout the present specification and the drawings, elements having substantially the same function and configuration are denoted with the same reference numerals to avoid any redundant description. Further, elements that are not directly related to the disclosure are unillustrated in the drawings. The drawings are schematic and are not intended to be drawn to scale.

FIG. 1 is a diagram illustrating a configuration of a component machining apparatus 1. As illustrated in FIG. 1, the component machining apparatus 1 includes a computer 2, a machining device 3, and a measurer 4. The component machining apparatus 1 manufactures multiple components that constitute a single structure (such as an aircraft). The multiple components are assembled in an assemblage site to complete the single structure.

The computer 2 includes elements such as a central processing unit (CPU), a ROM storing programs and the like, and a RAM serving as a work area. The computer 2 loads the programs stored in the ROM onto the RAM and executes the programs so as to function as a three-dimensional model generator 10, a measurement result acquiring unit 12, a virtual model generator 14, and a machining data generator 16. Each element of the computer 2 will be described in detail later.

The machining device 3 and the measurer 4 are coupled to the computer 2. In a wired or wireless manner, the machining device 3 and the measurer 4 may be coupled to the computer 2. With another computer, the machining device 3 and the measurer 4 maybe coupled to the computer 2. Alternatively, the computer 2 may transmit and receive data to and from the machining device 3 and the measurer 4 using storage media without being coupled to the machining device 3 and the measurer 4.

Examples of the machining device 3 include an NC machine. Based on machining data output from the computer 2, the machining device 3 machines, for example, cuts a workpiece W disposed on a worktable 5 so as to manufacture a component that constitutes the structure.

Examples of the measurer 4 include a laser tracker and a camera, which are capable of measuring a three-dimensional shape. The measurer 4 measures a three-dimensional shape of a component manufactured by the machining device 3.

In manufacturing a single structure, the computer 2 first generates a three-dimensional model of the structure. The three-dimensional model generator 10 includes three-dimensional CAD software. The three-dimensional model of the structure is generated on the three-dimensional CAD software.

The three-dimensional model includes information used for machining the multiple components such as shapes, materials, dimensional tolerances, and machining methods of the components.

When the three-dimensional model is generated, the machining data generator 16 generates machining data of a component of interest based on the three-dimensional model, and outputs the machining data to the machining device 3. The machining data is data (an NC program) readable by the machining device 3. The machining data includes information such as a movement route and a selected tool of the machining device 3 to manufacture the component from a workpiece W. It is noted that insofar as the machining data generator 16 generates the machining data, the machining data may be generated by operation such as manual input by an operator.

Upon receipt of the machining data, the machining device 3 machines the workpiece W based on the input machining data to manufacture the component.

At this stage, the component manufactured by the machining device 3 may have a dimensional tolerance and distortion, for example, which may become an error deviated from the three-dimensional model (machining data). Moreover, the component manufactured by the machining device 3 may have an attitude when machined that is different from an attitude when actually assembled. In such a case, the manufactured component may be deformed by its own weight when actually assembled and may have an error deviated from the three-dimensional model.

As a result, when components manufactured based on the three-dimensional model (machining data) are assembled, such errors may make gaps in the structure.

In view of this, in the component machining apparatus 1, the measurer 4 measures a three-dimensional shape of a component manufactured by the machining device 3 (hereinafter referred to also as "manufactured component"). At this time, the three-dimensional shape of the manufactured component that has been manufactured by the machining device 3 is measured in the attitude in which the component is actually assembled into the structure. In other words, the measurer 4 measures the three-dimensional shape of the manufactured component maintained in the attitude when assembled into the structure.

From the measurer 4, the measurement result acquiring unit 12 acquires a measurement result (measurement data) obtained by the measurer 4 measuring the three-dimensional shape of the manufactured component. Based on the three-dimensional shape (measurement result) of the manufactured component acquired by the measurement result acquiring unit 12 and the three-dimensional model, the virtual model generator 14 generates a three-dimensional virtual model of a component of interest so as not to make a gap between the manufactured component and the component of interest. The component of interest is a component to be machined by the machining device 3.

At this stage, the virtual model generator 14 may use an automatic generation program to insert the three-dimensional shape of the manufactured component in the three-dimensional model, thereby automatically generating the three-dimensional virtual model of the component of interest. Alternatively, the virtual model generator 14 may insert the three-dimensional shape of the manufactured component in the three-dimensional model, and for example, the operator may perform manual input to generate the three-dimensional virtual model.

When the virtual model generator 14 generates the three-dimensional virtual model, the machining data generator 16 generates machining data of the component of interest and outputs the machining data to the measurer 4. Based on the machining data, the machining device 3 machines the workpiece W to manufacture the component of interest.

In this manner, the component machining apparatus 1 generates the machining data of the component of interest based on the three-dimensional shape (measurement result) of the manufactured component, so that the machining data of the component of interest can be generated considering an error of the manufactured component.

Thus, the component machining apparatus 1 assembles the multiple components without making gaps in the structure. Since no gaps are made in the structure, the component machining apparatus 1 manufactures no shims, thereby reducing the number of working steps. Moreover, the component machining apparatus 1 reduces a gap tightening amount of the components, thereby improving accuracy in assemblage of the components.

Specific examples will be given below to describe manufacturing steps of the components.

Figure 2A:
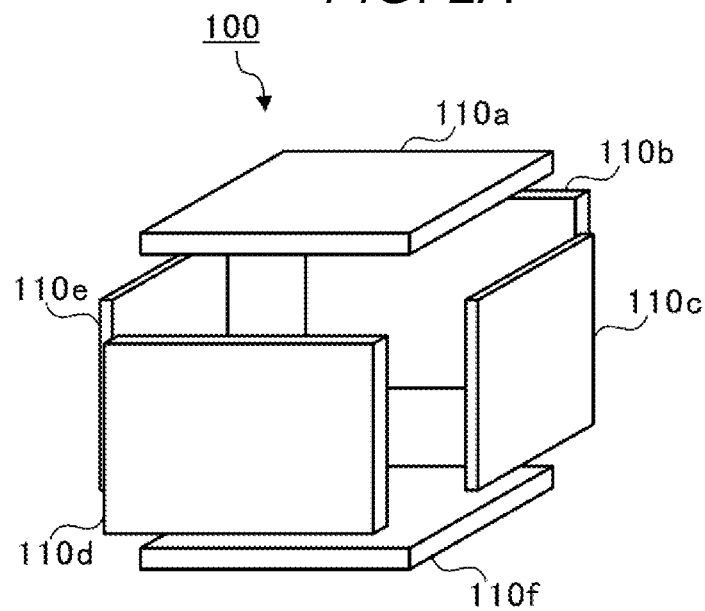
FIG. 2A is an exploded perspective view of a structure.
Figure 2B:
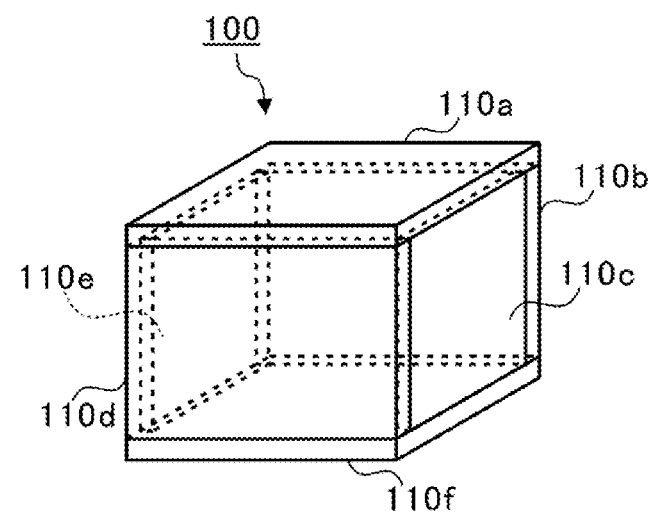
FIG. 2B is a perspective view of the structure after assemblage.

FIGS. 2A and 2B illustrate an example structure 100. FIG. 2A is an exploded perspective view of the structure 100. FIG. 2B is a perspective view of the structure 100 after assemblage. As illustrated in FIGS. 2A and 2B, the structure 100 is completed by assembling, for example, six components 110*a* to 110*f*.

The components 110*b* to 110*e* are coupled to the component 110*a*. The components 110*a*, 110*c*, 110*e*, and 110*f* are coupled to the component 110*b*. The components 110*a*, 110*b*, 110*d*, and 110*f* are coupled to the component 110*c*. The components 110*a*, 110*c*, 110*e*, and 110*f* are coupled to the component 110*d*. The components 110*a*, 110*b*, 110*d*, and 110*f* are coupled to the component 110*e*. The components 110*b* to 110*e* are coupled to the component 110*f*.

The components 110*a* to 110*f* are manufactured in a predetermined order. For example, the components 110*a* to 110*e* are manufactured earlier than the component 110*f*, and the component 110*f* is manufactured last.

In such a case, of a three-dimensional model, the machining data generator 16 first outputs to the machining device 3 machining data of each of the components 110*a* to 110*e* to be manufactured first.

Upon receipt of the machining data, the machining device 3 machines a workpiece W based on the input machining data to manufacture each of the components 110*a* to 110*e*.

When the components 110*a* to 110*e* are manufactured, the measurer 4 measures three-dimensional shapes of the components 110*a* to 110*e* as the manufactured components. From the measurer 4, the measurement result acquiring unit 12 acquires measurement results of the three-dimensional shapes of the components 110*a* to 110*e*.

Based on the measurement results of the three-dimensional shapes of the components 110*a* to 110*e* acquired by the measurement result acquiring unit 12, the virtual model generator 14 generates a three-dimensional virtual model of the component 110*f* as a component of interest.

Specifically, based on the three-dimensional model and the measurement results of the three-dimensional shapes of the components 110*a* to 110*e*, the virtual model generator 14 generates the three-dimensional virtual model of the component 110*f* so as not to make gaps when the component 110*f* is assembled with the rest of the structure 100. The virtual model generator generates the three-dimensional virtual model of the component 110*f* to make the component 110*f* an assemblage reference of the structure 100. That is, the virtual model generator 14 generates the three-dimensional virtual model to couple the component 110*f* to the components 110*b* to 110*e* without gaps.

When the virtual model generator 14 generates the three-dimensional virtual model of the component 110*f*, the machining data generator 16 outputs machining data of the component 110*f* to the machining device 3.

Upon receipt of the machining data, the machining device 3 machines a workpiece W based on the input machining data to manufacture the component 110*f*.

FIG. 3 is a diagram illustrating a workpiece W1 of the component 110*f*. As illustrated in FIG. 3, the workpiece W1 of the component 110*f* is preliminarily machined by the machining device 3 based on the three-dimensional model. Specifically, regions of the workpiece W1 other than regions to be coupled to the components 110*b* to 110*e* are machined based on the three-dimensional model, and the regions to be coupled to the components 110b to 110e include an excess W1a increased in thickness toward the components 110b to 110e as compared with the three-dimensional model.

The machining device 3 performs machining to remove the excess W1a based on the machining data. In this manner, the regions to be coupled to the components 110b to 110e include the excess W1a, so that even when the components 110a to 110e have machining errors or assemblage errors, the excess W1a can be machined to compensate for these errors.

Thus, the component machining apparatus 1 assembles the components 110a to 110f without making gaps in the structure 100. Since no gaps are made in the structure 100, the component machining apparatus 1 manufactures no shims, thereby reducing the number of working steps.

The embodiment of the disclosure has been described above with reference to the accompanying drawings. It is needless to say that the disclosure is not limited to such an embodiment. It is obvious that those skilled in the art would conceive various changes and modifications within the scope of claims, and it should be understood that such changes and modifications are included in the technical scope of the disclosure.

In the above-described embodiment, the components 110a to 110f that constitute the structure 100 are manufactured by the single machining device 3. However, the components 110a to 110f may be manufactured by different machining devices 3. For example, the components 110a to 110f may be manufactured in different sites.

In the embodiment, of the components 110a to 110f that constitute the structure 100, the components 110a to 110e are manufactured first, and the component 110f is manufactured last. However, the order of manufacturing the components 110a to 110f is not limited to this. For example, the components 110a to 110f may be manufactured sequentially.

In this case, when the component 110a is manufactured, the measurer 4 measures a three-dimensional shape of the component 110a. Based on a measurement result of the three-dimensional shape of the component 110a, the virtual model generator 14 generates a three-dimensional virtual model of the component 110b. Based on the generated three-dimensional virtual model of the component 110b, the machining data generator 16 outputs machining data of the component 110b to the machining device 3, and the machining device 3 manufactures the component 110b based on the machining data. In this manner, a process may be repeated in which the measurer 4 measures the three-dimensional shape of one component manufactured earlier and then the virtual model generator 14 generates the three-dimensional virtual model of one component of interest.

In the embodiment, the machining device 3 machines the workpiece W on the worktable 5. However, the machining device 3 may machine the workpiece W on an assemblage jig and a moving dolly in assembling the components. In this case, the machining data may be generated using the assemblage jig and the moving dolly as a reference, and the machining device 3 may be set using the assemblage jig and the moving dolly as a reference.

In the embodiment, in machining the component 110f, the workpiece W1 is preliminarily machined to include the excess W1a. However, preliminary machining may be omitted. In this case, the workpiece W1 including a portion equivalent to the excess W1a maybe prepared, and the workpiece W1 maybe machined based on the machining data in a single event to manufacture the component 110f.

In the embodiment, the six components 110a to 110f constitute the structure 100. However, the number of components that constitute the structure 100 maybe any number larger than one.

The invention claimed is:

1. A component machining apparatus comprising:
a measurement result acquiring unit configured to acquire a measurement result obtained by a measurer configured to measure a three-dimensional shape of a manufactured component among components of a structure, the manufactured component being manufactured prior to a component of interest, and wherein the manufactured component and the component of interest after manufacture is assembled to form the structure;
a virtual model generator device configured to generate a three-dimensional virtual model of the component of interest using the measurement result obtained by the measurer, wherein the three-dimensional virtual model of the component of interest is generated such that no gap exits between the manufactured component and the component of interest;
a machining data device configured to generate machining data of the component of interest on a basis of the generated three-dimensional virtual model of the component of interest; and
a machining device configured to perform a removal process on the component of interest on a basis of the generated machining data,
wherein the component of interest includes an excess that is a coupling portion to be coupled to the manufactured component, the excess protrudes toward the manufactured component in a case that the component of interest and the manufactured component are coupled, and
wherein when the machining device performs the removal process on the component of interest, the machining device removes a part of the excess on a basis of the generated machining data.

2. The component machining apparatus according to claim 1, wherein the measurement device is configured to acquire the measurement result obtained by the measurer measuring the manufactured component in an attitude in assemblage.

3. The component machining apparatus according to claim 1:
the machining device configured to machine a workpiece on a basis of the generated machining data so as to manufacture the component of interest.

4. The component machining apparatus according to claim 2:
the machining device configured to machine a workpiece on a basis of the machining data so as to manufacture the component of interest.

* * * * *